United States Patent
Kimura

(10) Patent No.: US 9,983,363 B2
(45) Date of Patent: May 29, 2018

(54) OPTICAL SEMICONDUCTOR DEVICE

(71) Applicant: Shinko Electric Industries Co., Ltd., Nagano-Ken (JP)

(72) Inventor: Yasuyuki Kimura, Nagano (JP)

(73) Assignee: Shinko Electric Industries Co., LTD., Nagano-Ken (JP)

( * ) Notice: Subject to any disclaimer, the term of this patent is extended or adjusted under 35 U.S.C. 154(b) by 0 days. days.

(21) Appl. No.: 15/650,857

(22) Filed: Jul. 15, 2017

(65) Prior Publication Data

US 2018/0031779 A1    Feb. 1, 2018

(30) Foreign Application Priority Data

Jul. 26, 2016  (JP) ................. 2016-146404

(51) Int. Cl.

| H01L 21/00 | (2006.01) |
|---|---|
| G02B 6/38 | (2006.01) |
| G02B 6/42 | (2006.01) |
| G02B 6/122 | (2006.01) |
| H01L 23/14 | (2006.01) |
| G02B 6/13 | (2006.01) |

(52) U.S. Cl.
CPC ......... *G02B 6/3839* (2013.01); *G02B 6/1221* (2013.01); *G02B 6/13* (2013.01); *G02B 6/4214* (2013.01); *H01L 23/142* (2013.01)

(58) Field of Classification Search
CPC ............................................. H01L 2251/5338
See application file for complete search history.

(56) References Cited

U.S. PATENT DOCUMENTS

| 2014/0232956 A1* | 8/2014 | Kwon | ............... G02F 1/133305 349/12 |
|---|---|---|---|
| 2014/0254111 A1* | 9/2014 | Yamazaki | ........... H01L 51/0097 361/749 |
| 2015/0028328 A1* | 1/2015 | Ikeda | .................. H01L 27/1218 257/43 |
| 2015/0048349 A1* | 2/2015 | Kawata | ............... H01L 51/0097 257/40 |
| 2016/0019019 A1* | 1/2016 | Ikeda | ................... G06F 3/1446 345/173 |
| 2016/0147109 A1* | 5/2016 | Yamazaki | ......... G02F 1/133345 349/42 |

FOREIGN PATENT DOCUMENTS

JP           4279134 B2    7/2005

* cited by examiner

*Primary Examiner* — Thao P Le
(74) *Attorney, Agent, or Firm* — Wolf, Greenfield & Sacks, P.C.

(57) ABSTRACT

An optical semiconductor device includes a base, a wiring substrate, and a sub-mount. The base includes a bottom wall, a side wall projecting from a peripheral edge of the bottom wall, and a flange extending outward from an upper end of the side wall. The wiring substrate includes a distal portion inserted into and fixed to the base. An optical element is mounted on the sub-mount. The bottom wall of the base includes a first seat to which the sub-mount is fixed and a second seat to which the distal portion is fixed. The second seat is located at a higher position than the first seat. An upper surface of the distal portion of the wiring substrate includes a pad connected to the optical element. An upper surface of the pad of the distal portion is flush with an upper surface of an electrode of the optical element.

7 Claims, 5 Drawing Sheets

(Comparative Example)

OPTICAL SEMICONDUCTOR DEVICE

CROSS-REFERENCE TO RELATED APPLICATIONS

This application is based upon and claims the benefit of priority from prior Japanese Patent Application No. 2016-146404, filed on Jul. 26, 2016, the entire contents of which are incorporated herein by reference.

FIELD

This disclosure relates to an optical semiconductor device.

BACKGROUND

An optical semiconductor device used for optical communication or the like includes a disk-shaped metal header. A light emitting element is mounted on the header. A lead pin is fixed to the header. The lead pin extends through the header and provides signals to the light emitting element. Japanese Patent No. 4279134 describes a conventional optical semiconductor device.

SUMMARY

When using such an optical semiconductor device for high-speed communication, the characteristics of the optical semiconductor device may affect communication. For example, when the characteristic impedance of a transmission path, which provides signals to the optical semiconductor device, deviates from a given value (e.g., 50Ω), the reflection or loss of the signal may be increased in accordance with the deviation. It is thus desirable that the characteristics of the optical semiconductor device be improved.

One embodiment of this disclosure is an optical semiconductor device including a base, a wiring substrate, and a sub-mount. The base includes a bottom wall, a side wall projecting from a peripheral edge of the bottom wall, and a flange extending outward from an upper end of the side wall. The side wall includes an inlet. The wiring substrate includes a distal portion inserted into the base from the inlet and fixed to the base. The sub-mount includes an upper surface onto which an optical element is mounted. The bottom wall of the base includes a first seat to which the sub-mount is fixed and a second seat to which the distal portion is fixed. The second seat is located at a higher position than the first seat. An upper surface of the distal portion of the wiring substrate includes a pad connected to the optical element. An upper surface of the pad of the distal portion is flush with an upper surface of an electrode of the optical element.

Other embodiments and advantages thereof will become apparent from the following description, taken in conjunction with the accompanying drawings, illustrating by way of example the principles of this disclosure.

It is to be understood that both the foregoing general description and the following detailed description are exemplary and explanatory and are not restrictive of the invention, as claimed.

BRIEF DESCRIPTION OF THE DRAWINGS

The embodiments, together with objects and advantages thereof, may best be understood by reference to the following description of the presently preferred embodiments together with the accompanying drawings in which.

DESCRIPTION OF THE EMBODIMENTS

Figure 1A:
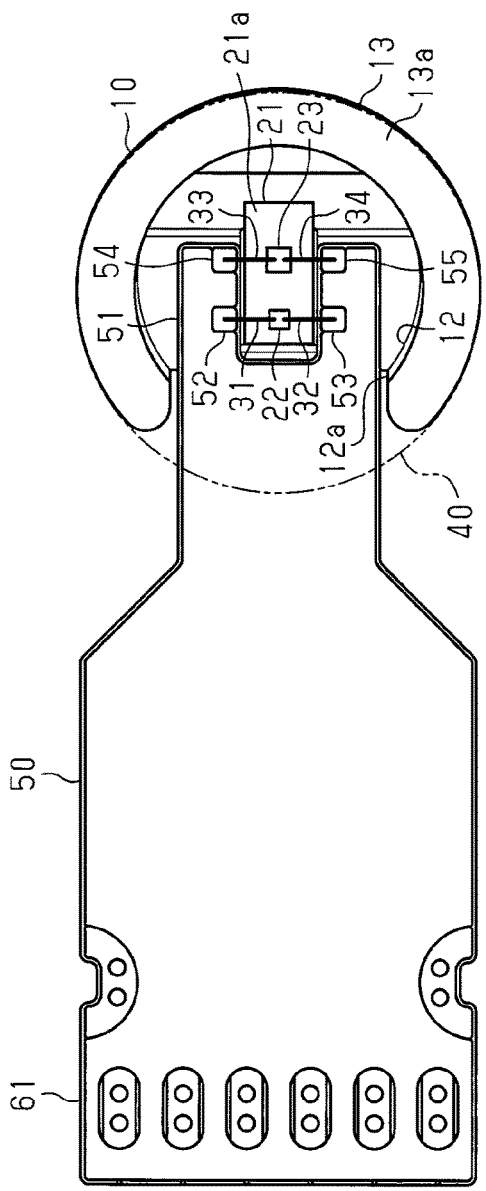
FIG. 1A is a plan view of an optical semiconductor device.

In the drawings, elements are illustrated for simplicity and clarity and have not necessarily been drawn to scale. Reference characters included in a drawing may be omitted from other drawings.

In this specification, a plan view refers to the view of a subject taken from above or below (vertical direction in FIG. 1B) and a planar shape refers to the shape of a subject as viewed in the vertical direction.

Figure 1B:
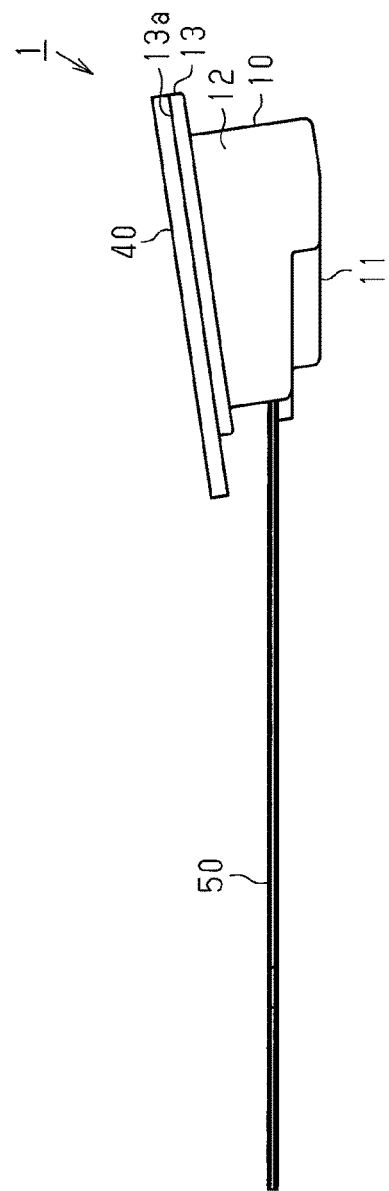
FIG. 1B is a side view of the optical semiconductor device illustrated in FIG. 1A.

Referring to FIGS. 1A and 1B, an optical semiconductor device 1 includes a base 10, a window glass 40 fixed to an upper portion of the base 10, and a wiring substrate 50 connected to the base 10. In FIG. 1A, the window glass 40 is indicated by the broken lines.

Figure 2A:
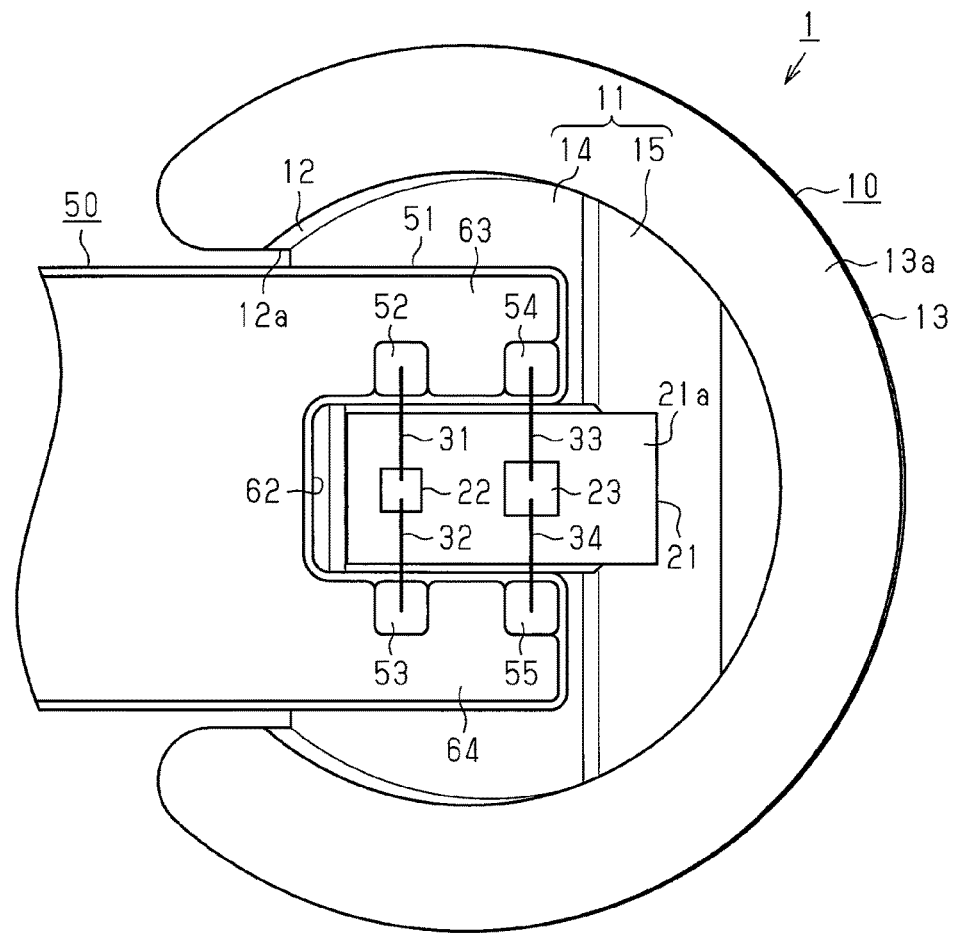
FIG. 2A is partially enlarged plan view of the optical semiconductor device illustrated in FIG. 1A.

Referring to FIG. 2A, a distal portion 51 of the wiring substrate 50 is fixed to the base 10. A sub-mount 21 is fixed to the inside of the base 10. The sub-mount 21 has rectangular parallelepiped shape and is formed from a material having high thermal conductivity such as copper (Cu).

A light emitting element 22 is mounted on an upper surface 21a of the sub-mount 21. The light emitting element 22 may be, for example, a semiconductor laser such as a Vertical Cavity Surface Emitting Laser (VCSEL). The light emitting element 22 includes a light emitting surface directed toward the upper side when mounted on the sub-mount 21. A conductive connecting member (not illustrated) connects the light emitting element 22 to the sub-mount 21. The connecting member may be, for example, solder, a conductive paste, a conductive resin, or the like. A laser diode (LD) may be used as the light emitting element 22.

A light receiving element 23 is mounted on the upper surface 21a of the sub-mount 21. A photodiode (PD) may be used as the light receiving element 23. The light receiving element 23 includes a light receiving surface directed toward the upper side when mounted on the sub-mount 21. In the same manner as the light emitting element 22, a conductive connecting member (not illustrated) connects the light receiving element 23 to the sub-mount 21.

The light receiving element 23 functions to monitor the light emitting element 22. The light emitted from the light emitting element 22 is transmitted through the window glass 40 illustrated in FIG. 1B. Some of the light that is emitted from the light emitting element 22 and reflected by the window glass 40 is received by the light receiving element 23. In this manner, the light receiving element 23 monitors the light emitted from the light emitting element 22.

The light emitting element 22 is connected by bonding wires 31 and 32 to pads 52 and 53 of the wiring substrate 50. The light receiving element 23 is connected by bonding wires 33 and 34 to pads 54 and 55 of the wiring substrate 50.

The base 10 of the optical semiconductor device 1 will now be described in detail.

Figure 3A:
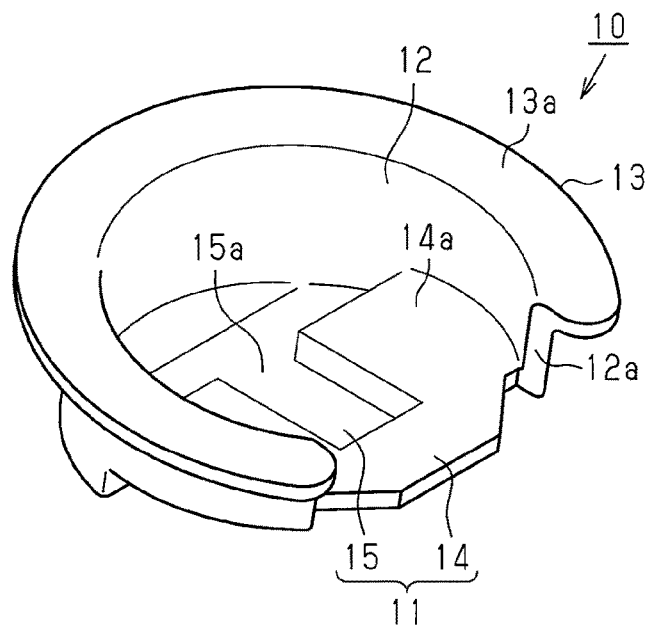
FIG. 3A is a perspective view of a base of the optical semiconductor device illustrated in FIG. 1A as viewed from above.
Figure 3B:
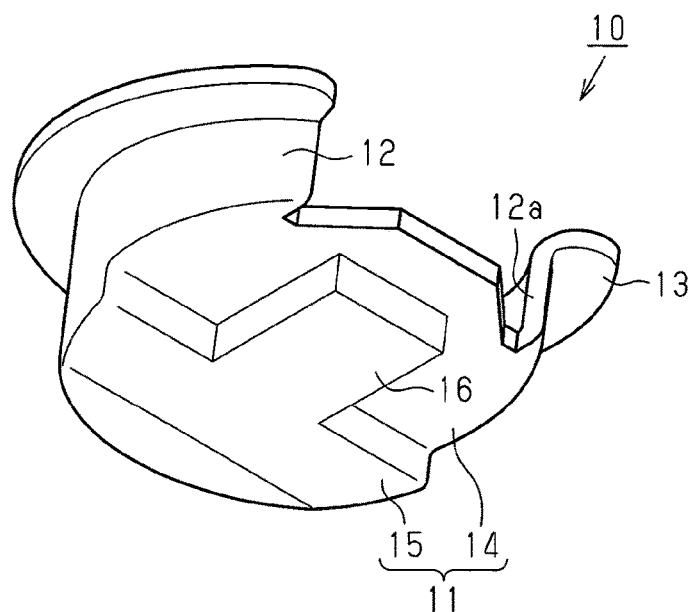
FIG. 3B is a perspective view of the base illustrated in FIG. 3A as viewed from below.

Referring to FIGS. 3A and 3B, the base 10 includes a bottom wall 11, a side wall 12, and a flange 13.

The planar shape of the bottom wall 11 is generally circular. The side wall 12 projects from the peripheral edge of the bottom wall 11. In a plan view, the side wall 12 is generally circular and partially open in the circumferential direction. For example, the side wall 12 is C-shaped. As illustrated in FIG. 2A, the opening in the side wall 12 functions as an inlet 12a. The distal portion 51 of the wiring substrate 50 is inserted into the base 10 from the inlet 12a.

Referring to FIGS. 3A and 3B, the flange 13 extends from the upper end of the side wall 12 toward the outer side of the base 10. Like the side wall 12, in a plan view, the flange 13 is generally circular and partially open in the circumferential direction. For example, the flange 13 is C-shaped. The window glass 40 illustrated in FIG. 1B is attached to an upper surface 13a of the flange 13. The window glass 40 is fixed to the upper surface 13a of the flange 13 by, for example, an epoxy adhesive.

Referring to FIG. 1B, in the base 10, the flange 13 is inclined relative to the bottom wall 11 by a given angle. That is, the base 10 is formed so that the angle between the bottom wall 11 and the flange 13 is a given value (e.g., 17 degrees).

Referring to FIGS. 3A and 3B, the bottom wall 11 includes a substrate seat 14 (second seat) and a mount seat 15 (first seat). In the base 10, the substrate seat 14 is located at the same side as the inlet 12a in the side wall 12. The substrate seat 14 is generally semi-circular in a plan view and includes a rectangular recess in the central portion of the base 10. In this example, the substrate seat 14 is, for example, U-shaped in a plan view and includes a first portion, which extends out of the inlet 12a, and two second portions, which extend from the opposite sides of the first portion along the side wall 12 in the circumferential direction.

In the base 10, the mount seat 15 is located at the side opposite to the inlet 12a in the side wall 12. The mount seat 15 is generally semi-circular in a plan view and includes a rectangular extension corresponding to the rectangular recess of the substrate seat 14. In this example, the mount seat 15 is, for example, T-shaped in a plan view and includes a first portion, which extends along the side wall 12 in the circumferential direction at the side opposite to the inlet 12a, and a second portion (rectangular extension), which extends from the central part of the first portion toward the inlet 12a.

The base 10 is formed such that an upper surface 14a of the substrate seat 14 and an upper surface 15a of the mount seat 15 are located at different heights. In the present example, as illustrated in FIG. 3A, the upper surface 14a of the substrate seat 14 is located at a higher position than the upper surface 15a of the mount seat 15. Accordingly, as illustrated in FIG. 3B, the substrate seat 14 and the mount seat 15 form a projection 16 in the lower surface of the bottom wall 11.

The base 10 may be formed from a material having superior heat dissipation characteristics. Preferably, the base 10 is formed from a material that allows for easy processing. The base 10 is formed, for example, through a drawing process performed by a stamping device. Examples of such a material include copper (Cu) and an alloy of which the main component is Cu. For example, iron-nickel (Fe—Ni) or an Fe—Ni-based alloy may be used as the material of the base 10.

Figure 2B:
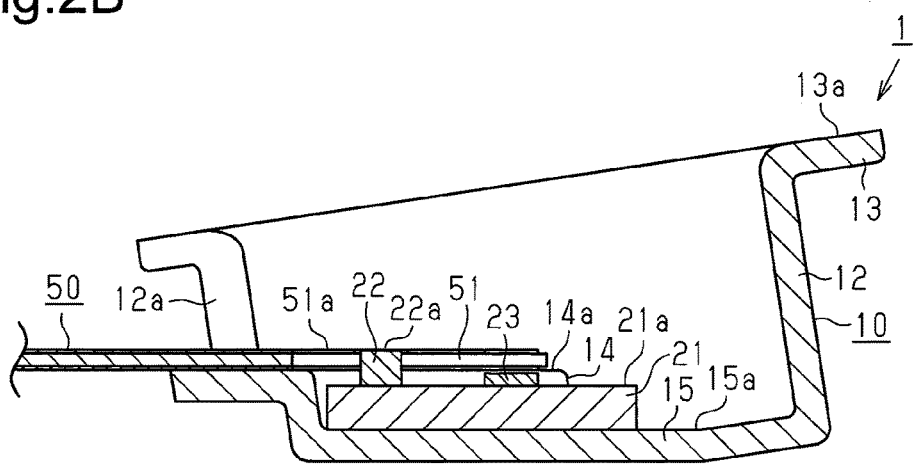
FIG. 2B is partially enlarged cross-sectional view of the optical semiconductor device illustrated in FIG. 1A.

Referring to FIG. 2A, the distal portion 51 of the wiring substrate 50 is connected by a connecting material (not illustrated) to the upper surface 14a of the substrate seat 14 in the base 10. The connecting material for connecting the distal portion 51 to the upper surface 14a of the substrate seat 14 may be, for example, solder or an adhesive formed by a conductive resin. Referring to FIG. 2B, the sub-mount 21 is connected by a connecting material (not illustrated) to the upper surface 15a of the mount seat 15. The connecting material for connecting the sub-mount 21 to the upper surface 15a of the mount seat 15 may be, for example, solder or an adhesive formed by a resin having good thermal conductivity.

Referring to FIG. 2A, the distal portion 51 of the wiring substrate 50 includes a slot 62. The slot 62 extends from the distal portion 51 toward a basal portion 61 (refer to FIG. 1A). The slot 62 forms two terminals 63 and 64 in the distal portion 51 of the wiring substrate 50. The terminals 63 and 64 extend parallel to each other. Further, the terminals 63 and 64 are spaced apart from each other and sandwich the sub-mount 21. The pads 52 and 54 are formed on the upper surface of the terminal 63. The pads 53 and 55 are formed on the upper surface of the terminal 64. The pads 52 and 53 are respectively connected by the bonding wires 31 and 32 to the light emitting element 22. The bonding wires 31 and 32 may be formed from gold (Au), Cu, aluminum (Al), or the like. The pads 54 and 55 are respectively connected by the bonding wires 33 and 34 to the light receiving element 23. The bonding wires 33 and 34 may be formed from gold (Au), Cu, aluminum (Al), or the like.

Referring to FIG. 2B, the distal portion 51 of the wiring substrate 50 adhered to the base 10 includes an upper surface 51a that is flush with an upper surface 22a of the light emitting element 22. That is, the upper surface 51a of the distal portion 51 and the upper surface 22a of the light emitting element 22 are located at the same height. In the present example, the bottom wall 11 of the base 10 (substrate seat 14 and mount seat 15) and the sub-mount 21 each have a thickness and shape set such that the upper surface 51a of the distal portion 51 and the upper surface 22a of the light emitting element 22 are located at the same height.

The arrangement of the distal portion 51 and the light emitting element 22 allows the bonding wires 31 and 32 (refer to FIG. 2A), which connect the distal portion 51 and the light emitting element 22, to be shortened in length. If the upper surface 51a of the distal portion 51 and the upper surface 22a of the light emitting element 22 were to be located at different heights, the lengths of the bonding wires 31 and 32 would have to be increased by an amount corresponding to the height difference.

Referring to FIG. 2A, the pads 52 and 53, which are connected to the light emitting element 22, are located on the edges of the corresponding terminals 63 and 64 at the sides adjacent to the sub-mount 21. That is, the pads 52 and 53, which are connected to the light emitting element 22, are located at positions adjacent to the sub-mount 21, on which the light emitting element 22 is mounted. The arrangement of the pads 52 and 53 allows the bonding wires 31 and 32, which connect the light emitting element 22 with the pads 52 and 53, to be shortened in length.

Figure 4A:
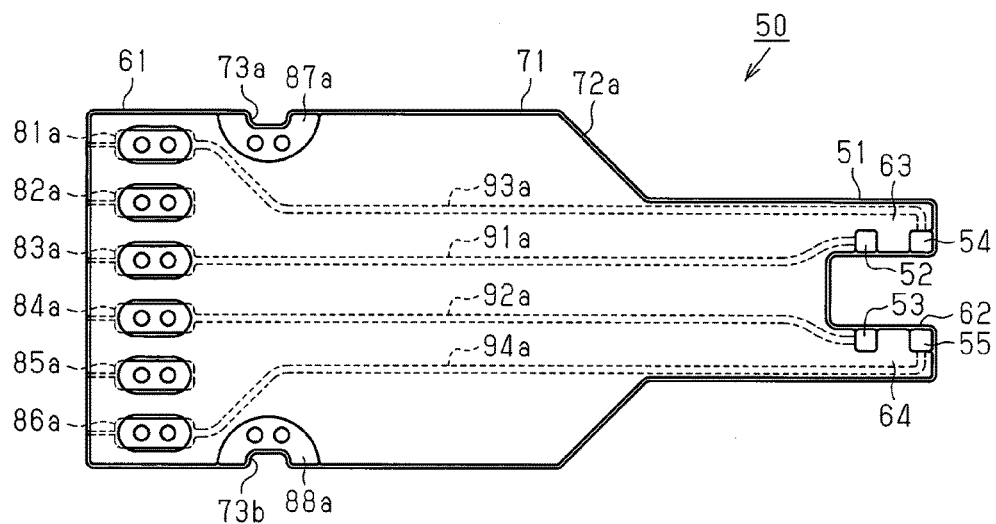
FIG. 4A is a plan view of an upper surface of a wiring substrate of the optical semiconductor device illustrated in FIG. 1A.
Figure 4B:
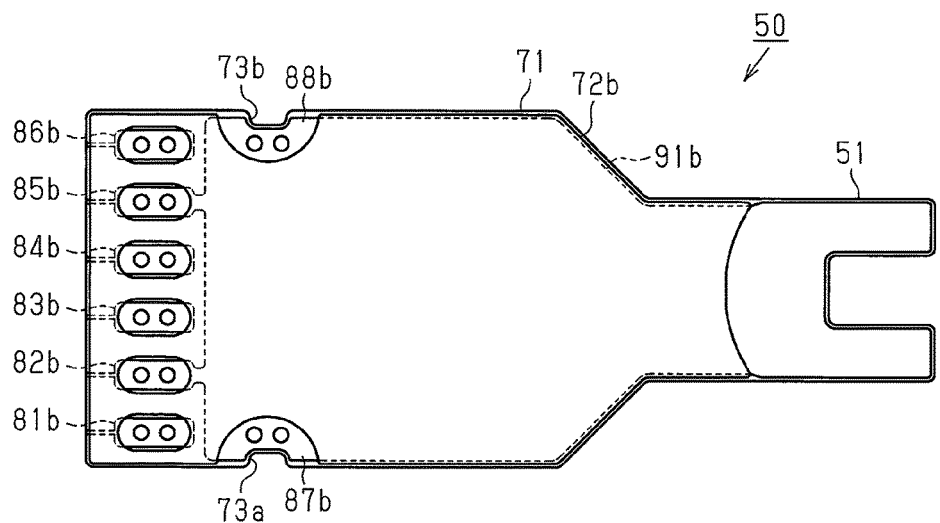
FIG. 4B is a plan view of a lower surface of the wiring substrate illustrated in FIG. 4A.

Referring to FIGS. 4A and 4B, the wiring substrate 50 is, for example, a flexible substrate. As illustrated in FIG. 4A, the wiring substrate 50 includes a base material 71. The base material 71 is increased in width (dimension in vertical direction as viewed in FIG. 4A) at a middle portion so that the basal portion 61 (left portion in FIG. 4A) has a greater width than the distal portion 51 (right portion in FIG. 4A). The base material 71 may be, for example, a flexible film-like substrate formed from a resin, such as polyimide resin or polyester resin, or a liquid crystal polymer.

A first wiring layer is formed on an upper surface of the base material 71. In the present embodiment, the first wiring layer includes the pads 52 to 54, connection terminals 81a to 86a of the basal portion 61, and wiring patterns 91a to 94a. The wiring pattern 91a connects the pad 52 with the connection terminal 83a. In the same manner, the wiring patterns 92a, 93a, and 94a connect the pads 53, 54, and 55 with the connection terminals 84a, 81a, and 86a. The pads 52 to 55, the connection terminals 81a to 86a, and the wiring patterns 91a to 94a are formed from copper (Cu) or a copper alloy. That is, the first wiring layer is formed from copper (Cu) or a copper alloy.

A protective layer 72a is formed on the upper surface of the base material 71. The protective layer 72a covers the upper surface of the base material 71. Further, the first wiring layer is partially exposed to the outside from the protective layer 72a. In the present embodiment, the pads 52 to 55 and the connection terminals 81a to 86a are exposed to the outside from the protective layer 72a, and the wiring patterns 91a to 94a are covered by the protective layer 72a. The protective layer 72a may be formed from, for example, a photosensitive epoxy insulative resin or a photosensitive acrylic insulative resin.

A plating layer is formed on the surface of the first wiring layer that is exposed to the outside from the protective layer 72a. That is, the plating layer is formed on the surfaces of the pads 52 to 54 and the connection terminals 81a to 86a. The plating layer is, for example, a nickel (Ni) layer/gold (Au) layer (metal layer in which Ni layer is bottom layer and Au layer is formed on Ni layer). The plating layer may also be an Au layer or an Ni layer/palladium (Pd) layer/Au layer. For example, an electroless metal plating layer formed through electroless plating may be used as the Au layer, Ni layer, and Pd layer. The Au layer is a metal layer formed from Au or an Au alloy. The Ni layer is a metal layer formed from Ni or an Ni alloy. The Pd layer is a metal layer formed from Pd or a Pd alloy.

Referring to FIG. 4B, a second wiring layer is formed on a lower surface of the base material 71. In the present embodiment, the second wiring layer includes connection terminals 81b to 86b of the basal portion 61 and a wiring pattern 91b. The wiring pattern 91b is planar and covers substantially the entire lower surface of the base material 71. The wiring pattern 91b is connected to the connection terminals 82b and 85b. The connection terminals 81a to 86b and the wiring pattern 91b are formed from copper (Cu) or a copper alloy. That is, the second wiring layer is formed from copper (Cu) or a copper alloy.

In the present embodiment, the connection terminals 81b to 86b are respectively connected to the connection terminals 81a to 86a, which are illustrated in FIG. 4A. For example, through wiring (through electrode), which is formed on the wall surface of a through hole extending through the base material 71, connects the connection terminal 81b to the connection terminal 81a. The connection terminals 82b to 86b are respectively connected to the connection terminals 82a to 86a in the same manner.

A protective layer 72b covers the lower surface of the base material 71. The second wiring layer is partially exposed to the outside from the protective layer 72b. In the present embodiment, the connection terminals 81b to 86b are exposed to the outside from the protective layer 72b, and the wiring pattern 91b is exposed to the outside at the distal portion 51. The protective layer 72b may be formed from, for example, a photosensitive epoxy insulative resin or a photosensitive acrylic insulative resin. The portion of the wiring pattern 91b exposed to the outside from the protective layer 72b defines a connection portion that connects the wiring substrate 50 to the substrate seat 14 of the base 10 (refer to FIG. 3A).

A plating layer is formed on the surface of the second wiring layer that is exposed to the outside from the protective layer 72b. That is, the plating layer is formed on the surfaces of the connection terminals 81a to 86a and the wiring pattern 91b of the distal portion 51. The plating layer is, for example, a nickel (Ni) layer/gold (Au) layer (metal layer in which Ni layer is bottom layer and Au layer is formed on Ni layer). The plating layer may also be an Au layer or an Ni layer/palladium (Pd) layer/Au layer. For example, an electroless metal plating layer formed through electroless plating may be used as the Au layer, Ni layer, and Pd layer. The Au layer is a metal layer formed from Au or an Au alloy. The Ni layer is a metal layer formed from Ni or an Ni alloy. The Pd layer is a metal layer formed from Pd or a Pd alloy. The material of the plating layer (layer configuration) on the upper side of the base material 71 may differ from the material of the plating layer (layer configuration) on the lower side of the base material 71.

Referring to FIG. 4A, the two sides (upper and lower sides as viewed in FIG. 4A) of the base material 71 respectively include rectangular slots 73a and 73b. Semicircular wiring patterns 87a and 88a are respectively formed at the inner sides of the slots 73a and 73b. The wiring patterns 87a and 88a are exposed to the outside from the protective layer 72a. A plating layer is formed on the surfaces of the wiring patterns 87a and 88a in the same manner as the pad 52 or the like.

Referring to FIG. 4B, wiring patterns 87b and 88b are formed on the lower surface of the base material 71 at the inner sides of the slots 73a and 73b by semicircular portions of the wiring pattern 91b exposed from the protective layer 72b. In the same manner as the wiring pattern 91b, a plating layer is formed on the surfaces of the wiring patterns 87b and 88b. In the same manner as the connection terminals 81b to 86b, the wiring patterns 87b and 88b are respectively connected to the wiring patterns 87a and 88a, which are illustrated in FIG. 4A.

The slots 73a and 73b and the wiring patterns 87a, 88a, 87b, and 88b function, for example, as fastening portions that fasten the wiring substrate 50 to a housing or the like. The wiring patterns 87a, 88a, 87b, and 88b are used to set the wiring pattern 91b to a given potential of the housing (e.g., ground potential).

A comparative example compared with the optical semiconductor device 1 will now be described with reference to FIG. 6. Same reference numerals are given to those components of the comparative example that are the same as the corresponding components of the optical semiconductor device 1 in the present embodiment.

Figure 6:
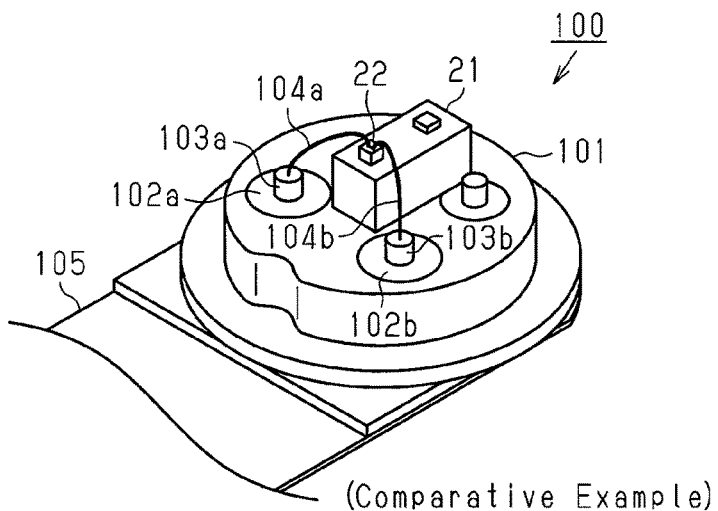
FIG. 6 is a perspective view illustrating a comparative example of an optical semiconductor device.

As illustrated in FIG. 6, an optical semiconductor device 100 of the comparative example includes a circular metal header 101 and leads 103a and 103b. The leads 103a and 103b are arranged in through holes extending through the header 101 in a thicknesswise direction and encapsulated in encapsulation materials 102a and 102b. The sub-mount 21 is fixed to an upper surface of the header 101. The light emitting element 22 is mounted on the upper surface of the sub-mount 21. The light emitting element 22 is, for example, a surface emitting laser. Electrodes of the light emitting element 22 are connected to the leads 103a and 103b by bonding wires 104a and 104b. A wiring substrate 105 is adhered to a lower surface of the header 101. The wiring substrate 105 is, for example, a flexible substrate. The leads 103a and 103b are inserted into through holes of the wiring substrate 105 and connected to a wiring layer of the wiring substrate 105.

In the optical semiconductor device 100 of the present embodiment, the upper surface of the light emitting element 22, which is mounted on the sub-mount 21, is higher than the upper ends of the leads 103a and 103b. Further, the leads 103a and 103b are fixed to the header 101 by the encapsulation materials 102a and 102b. This separates the leads 103a and 103b from the sub-mount 21. Thus, the bonding wires 104a and 104b, which connect the light emitting element 22 to the leads 103a and 103b, are long. Further, in the optical semiconductor device 100, the leads 103a and 103b are connected at a right angle to the wiring layer of the wiring substrate 105. Such a connection may result in an impedance mismatch or deteriorate signals for driving the light emitting element 22 and thereby hinder characteristic improvement.

The operation of the optical semiconductor device 1 will now be described.

Referring to FIG. 2B, in the optical semiconductor device 1 of the present embodiment, the sub-mount 21 is fixed to the mount seat 15 of the base 10, and the light emitting element 22 is fixed to the upper surface 21a of the sub-mount 21. The distal portion 51 of the wiring substrate 50 is fixed to the substrate seat 14 of the base 10. The upper surface 51a of the distal portion 51 is flush with the upper surface 22a of the light emitting element 22. This allows the bonding wires 31 and 32 (refer to FIG. 2A), which connect the light emitting element 22 to the pads 52 and 53 formed on the distal portion 51 of the wiring substrate 50, to be shorter than the comparative example.

Referring to FIG. 2A, the distal portion 51 of the wiring substrate 50 includes the terminals 63 and 64 that extend along the sub-mount 21. The pads 52 and 53, which are connected to the light emitting element 22, are formed on the edges of the terminals 63 and 64 at the sides adjacent to the sub-mount 21. Thus, the distance from the light emitting element 22 to each of the pads 52 and 53 is shorter than the comparative example. This allows the bonding wires 31 and 32, which connect the light emitting element 22 to the pads 52 and 53, to be shorter than the comparative example.

Referring to FIGS. 4A and 4B, the wiring substrate 50 includes the planar wiring pattern 91b, which is formed on the lower surface of the base material 71, and the wiring patterns 91a to 94a, which are formed on the upper surface of the base material 71. The wiring patterns 91a to 94a and the planar wiring pattern 91b allow a transmission path, which provides the light emitting element 22 with signals, to be easily set to a characteristic impedance of 50Ω. This allows electric signals to be transmitted at high speeds and allows for application to high-capacity optical communication (e.g., 10 Gbps or greater).

Figure 5A:
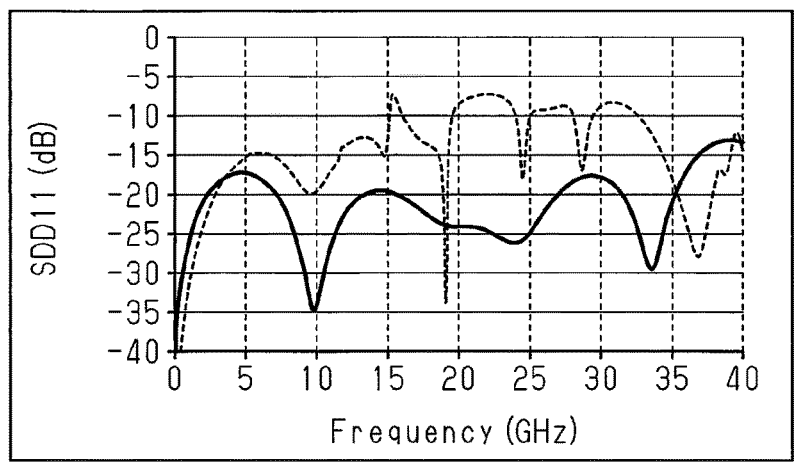
FIGS. 5A and 5B are graphs indicating the characteristics of the optical semiconductor device illustrated in FIG. 1A.
Figure 5B:
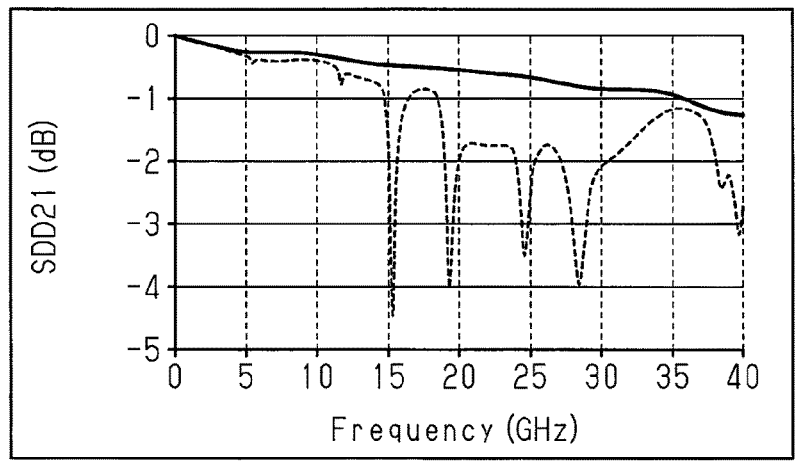

FIGS. 5A and 5B illustrate the simulation results of the S-parameters of the optical semiconductor device 1 in the present embodiment (solid lines) and the simulation results of the S-parameters of the optical semiconductor device 100 in the comparative example (broken lines). As illustrated in FIG. 5A, in S-parameter SDD11, the reflection characteristics of the differential transmission in the optical semiconductor device 1 of the present embodiment is improved from the optical semiconductor device 100 of the comparative example. As illustrated in FIG. 5B, in S-parameter SDD21, the loss characteristics of the optical semiconductor device 1 of the present embodiment is improved from the optical semiconductor device 100 of the comparative example.

The advantages of the present embodiment will now be described.

(1) The optical semiconductor device 1 does not include any connected portion like the optical semiconductor device 100 of the comparative example in which the leads 103a and 103b are connected at a right angle to the wiring substrate 105. This allows the electric signal transmission path to have improved impedance matching and characteristics.

(2) In the optical semiconductor device 1, the sub-mount 21 is fixed to the mount seat 15 of the base 10, and the light emitting element 22 is fixed to the upper surface 21a of the sub-mount 21. The distal portion 51 of the wiring substrate 50 is fixed to the substrate seat 14 of the base 10. Further, the upper surface 51a of the distal portion 51 is flush with the upper surface 22a of the light emitting element 22. This allows the bonding wires 31 and 32, which connect the light emitting element 22 to the pads 52 and 53 formed on the distal portion 51 of the wiring substrate 50, to be shorter in length than the comparative example. As a result, losses can be reduced and characteristics can be improved in the electric signal transmission path.

(3) The distal portion 51 of the wiring substrate 50 includes the terminals 63 and 64 that extend along the sub-mount 21. The pads 52 and 53, which are connected to the light emitting element 22, are formed on the edges of the terminals 63 and 64 at the sides adjacent to the sub-mount 21. Accordingly, the distance from the light emitting element 22 to each of the pads 52 and 53 is shorter than the comparative example. This allows the bonding wires 31 and 32, which connect the light emitting element 22 to the pads 52 and 53, to be shorter in length than the comparative example. As a result, losses can be reduced and characteristics can be improved in the electric signal transmission path.

(4) The wiring substrate 50 includes the planar wiring pattern 91b, which is formed on the lower surface of the base material 71, and the wiring patterns 91a to 94a, which are formed on the upper surface of the base material 71. The wiring patterns 91a to 94a and the planar wiring pattern 91b allow the characteristic impedance of the transmission path that provides the light emitting element 22 with signals to be easily set to 50Ω. This reduces reflection of electric signals and allows for improvement in the characteristics. Thus, electric signals can be transmitted at high speeds. This allows for application to high-capacity optical communication (e.g., 10 Gbps or greater).

It should be apparent to those skilled in the art that the foregoing embodiment may be employed in many other specific forms without departing from the scope of this disclosure. Particularly, it should be understood that the foregoing embodiment may be employed in the following forms.

In the above embodiment, the light emitting element 22 and the light receiving element 23 are mounted on the same sub-mount 21. However, the light emitting element 22 and the light receiving element 23 may be mounted on separate sub-mounts.

In the above embodiment, the light emitting element 22 and the light receiving element 23 are both mounted on the sub-mount 21. However, just the light receiving element 23 can be mounted on the sub-mount 21. The light receiving element 23 may be, for example, a photodiode. In this case, the window glass 40 may be omitted.

In the above embodiment, the shape of the base 10 may be changed. The side wall 12 of the base 10 has a circular shape in a plan view. Instead, the side wall 12 may have a polygonal shape, such as a hexagonal or octagonal shape.

In the above embodiment, the planar shape of the flange 13 does not have to be generally C-shaped as illustrated in FIG. 2A. As long as the side wall 12 of the flange 13 includes the inlet 12a, the flange 13 may have, for example, a ring-shaped planar shape.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to an illustration of the superiority and inferiority of the invention. Although embodiments have been described in detail, it should be understood that various changes, substitutions, and alterations could be made hereto without departing from the scope of this disclosure.

The invention claimed is:

1. An optical semiconductor device comprising:
   a base that includes a bottom wall, a side wall projecting from a peripheral edge of the bottom wall, and a flange extending outward from an upper end of the side wall, wherein the side wall includes an inlet;
   a wiring substrate that includes a distal portion inserted into the base from the inlet and fixed to the base; and
   a sub-mount that includes an upper surface onto which an optical element is mounted;
   wherein
   the bottom wall of the base includes a first seat to which the sub-mount is fixed and a second seat to which the distal portion is fixed, wherein the second seat is located at a higher position than the first seat;
   an upper surface of the distal portion of the wiring substrate includes a pad connected to the optical element;
   an upper surface of the pad of the distal portion is flush with an upper surface of an electrode of the optical element.

2. The optical semiconductor device according to claim 1, wherein
   the sub-mount has a rectangular parallelepiped shape,
   the distal portion of the wiring substrate includes two terminals sandwiching the sub-mount, and
   the pad connected to the optical element is formed on each of the two terminals.

3. The optical semiconductor device according to claim 2, wherein
   the two terminals sandwiching the sub-mount extend along the sub-mount, and
   the pad connected to the optical element is formed on an edge of each of the two terminals at a side that is adjacent to the sub-mount.

4. The optical semiconductor device according to claim 1, wherein the wiring substrate includes
   a base material,
   a planar wiring layer formed on a lower surface of the base material, and
   a wiring layer including a wiring pattern, the wiring pattern being formed on an upper surface of the base material and connected to the pad.

5. The optical semiconductor device according to claim 1, wherein
   the optical element is a light emitting element of a surface emitting type, and
   the light emitting element includes a light emitting surface directed toward an upper side when mounted on the sub-mount.

6. The optical semiconductor device according to claim 5, further comprising a window glass fixed to the flange, wherein the window glass covers an opening in the upper end of the side wall.

7. The optical semiconductor device according to claim 6, wherein
   the base is formed so that the window glass is inclined at a given angle relative to the bottom wall,
   the window glass reflects some of the light emitted from the light emitting element, and
   the base includes a light receiving element that receives the light reflected by the window glass.

* * * * *